United States Patent
Pitwon et al.

(10) Patent No.: US 9,883,618 B2
(45) Date of Patent: Jan. 30, 2018

(54) COMPUTING SYSTEM ENCLOSURE AIRFLOW DISTRIBUTION MANAGEMENT

(71) Applicant: Seagate Technology LLC, Cupertino, CA (US)

(72) Inventors: Richard Charles Alexander Pitwon, Fareham (GB); David Michael Davis, Portsmouth (GB)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 9 days.

(21) Appl. No.: 14/868,783

(22) Filed: Sep. 29, 2015

(65) Prior Publication Data
US 2017/0094832 A1   Mar. 30, 2017

(51) Int. Cl.
H05K 7/00   (2006.01)
H05K 7/20   (2006.01)

(52) U.S. Cl.
CPC ..... H05K 7/20836 (2013.01); H05K 7/20727 (2013.01)

(58) Field of Classification Search
None
See application file for complete search history.

(56) References Cited

U.S. PATENT DOCUMENTS

| | | | |
|---|---|---|---|
| 6,330,157 B1 | 12/2001 | Bezama et al. | |
| 6,957,544 B2 * | 10/2005 | Dobbs | F24F 11/053 165/80.3 |
| 6,991,533 B2 * | 1/2006 | Tsai | H05K 7/2019 361/695 |
| 7,251,547 B2 * | 7/2007 | Bash | G05D 23/1934 62/186 |
| 7,362,032 B2 | 4/2008 | Pelrine et al. | |
| 7,682,234 B1 * | 3/2010 | Beitelmal | F24F 11/0001 361/695 |
| 8,183,739 B2 | 5/2012 | Heim | |
| 8,190,303 B2 | 5/2012 | Lin et al. | |
| 8,397,088 B1 | 3/2013 | Ghose | |
| 8,432,700 B2 | 4/2013 | Katakura et al. | |
| 8,462,502 B2 | 6/2013 | Hirano et al. | |
| 8,744,631 B2 * | 6/2014 | Wang | G05D 23/1932 165/67 |

(Continued)

FOREIGN PATENT DOCUMENTS

JP    2013-114735 A    6/2013

*Primary Examiner* — Christopher E Everett
(74) *Attorney, Agent, or Firm* — Holzer Patel Drennan (57) ABSTRACT

The disclosed technology provides systems and methods for an enclosure system with optimized internal dynamically controllable airflow distribution. The systems include a computing system enclosure, comprising a plurality of baffles or airflow redirection modules, and a controller configured to control an orientation of one or more of the plurality of baffles or airflow redirection modules for redirection of airflow distribution within the computing system enclosure based on a determined computing system enclosure profile. In another implementation, a method includes monitoring airflow distribution within a computing system enclosure with a plurality of sensors, and controlling an orientation of one or more baffles or airflow redirection modules in the computing system based on results of the monitoring operation for redirection of airflow distribution.

17 Claims, 5 Drawing Sheets

(56) References Cited

U.S. PATENT DOCUMENTS

| | | | | |
|---|---|---|---|---|
| 8,882,572 B2* | 11/2014 | McReynolds | ...... | G05D 23/2716 |
| | | | | 137/343 |
| 8,885,335 B2* | 11/2014 | Magarelli | ............... | G06F 1/206 |
| | | | | 361/679.47 |
| 8,939,824 B1* | 1/2015 | Bash | .................. | H05K 7/20181 |
| | | | | 361/679.51 |
| 2005/0165586 A1* | 7/2005 | Moore | .................... | G06F 1/206 |
| | | | | 702/188 |
| 2006/0075764 A1* | 4/2006 | Bash | .................. | H05K 7/20745 |
| | | | | 62/178 |
| 2008/0269954 A1* | 10/2008 | Lev | ........................ | G05D 23/19 |
| | | | | 700/299 |
| 2009/0097203 A1* | 4/2009 | Byers | ................. | H05K 7/20618 |
| | | | | 361/695 |
| 2010/0057271 A1* | 3/2010 | Lewis | ................ | G05D 23/1919 |
| | | | | 700/300 |
| 2010/0155047 A1 | 6/2010 | Lin | | |
| 2010/0268121 A1 | 10/2010 | Kilborn | | |
| 2011/0184568 A1* | 7/2011 | Tai | ..................... | G05D 23/1934 |
| | | | | 700/282 |
| 2012/0136488 A1* | 5/2012 | Tan | .................... | H05K 7/20836 |
| | | | | 700/278 |
| 2014/0025223 A1* | 1/2014 | Chinnakkonda | ........ | G06F 1/206 |
| | | | | 700/300 |
| 2014/0133096 A1 | 5/2014 | Campbell et al. | | |
| 2015/0056908 A1 | 2/2015 | Chapel | | |
| 2015/0241077 A1* | 8/2015 | Ogawa | ................. | F24F 11/0012 |
| | | | | 700/276 |
| 2016/0095250 A1 | 3/2016 | Shelnutt | | |
| 2016/0237999 A1 | 8/2016 | Cordatos | | |

\* cited by examiner

COMPUTING SYSTEM ENCLOSURE AIRFLOW DISTRIBUTION MANAGEMENT

SUMMARY

The disclosed technology includes a method and system for managing a computing system enclosure. In one implementation, the disclosed technology includes a computing system enclosure comprising a plurality of baffles and a controller configured to control an orientation of one or more of the plurality of baffles for redirection of airflow distribution within the computing system enclosure based on a computing system enclosure profile. In another implementation, a method includes monitoring airflow distribution within the computing system enclosure with a plurality of sensors and controlling an orientation of one or more baffles in the computing system enclosure for redirection of airflow distribution based on determined parameters from the monitoring operation.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations as further illustrated in the accompanying drawings and defined in the appended claims.

These and various other features and advantages will be apparent from a reading of the following Detailed Description.

DETAILED DESCRIPTIONS

Various components in computing system enclosures (e.g., data storage arrays, storage servers, top of rack switches and converged platforms) generate heat within the system enclosures, which can have negative effects on a computing system. For example, a computing system enclosure may comprise of 80 or 90 disk drives generating heat. The heat can lead to reduced performance, and ultimately, system failure if the heat is not regulated.

Many computing system enclosures include mechanical devices that assist in regulating the heat generated in the enclosures. In some computing system enclosures, the enclosure components can be cooled with forced air generated by fans. However, the power consumption of fans represents a substantial percentage of overall power consumption in the enclosure. Also, fans can have mechanical problems, such as dust accumulation, which can lead to overheating and failure of a system.

Certain embodiments of the present disclosure include systems and methods for managing airflow distribution within the computing system enclosures. Implementations of such systems may dynamically control the internal airflow distribution of the computing system enclosures to optimize such internal airflow distribution. For example, the airflow distribution may be optimized to achieve higher efficiency, lower failure rates, etc. Some implementations of the technology described herein include dynamically monitoring various parameters within the computing system enclosure, analyzing the monitored parameters, and providing feedback based on the monitored results to control airflow distribution within the computing system enclosure. Such controlling of the airflow distribution may include controlling baffle structures or airflow redirection modules within the computing system enclosure to redirect airflow, dissipate heat, optimize fan speed power consumption, and/or reduce power consumption in the computing system enclosure.

The disclosed technology also includes using software or firmware to control the baffle structures or airflow redirection modules, for example, in response to changes in hot spot locations within the computing system enclosure and workload distribution of the computing system enclosure. The systems and methods disclosed herein may have applications in data centers, optically interconnected exascale data center architectures, corresponding cloud infrastructures, etc.

Figure 1:
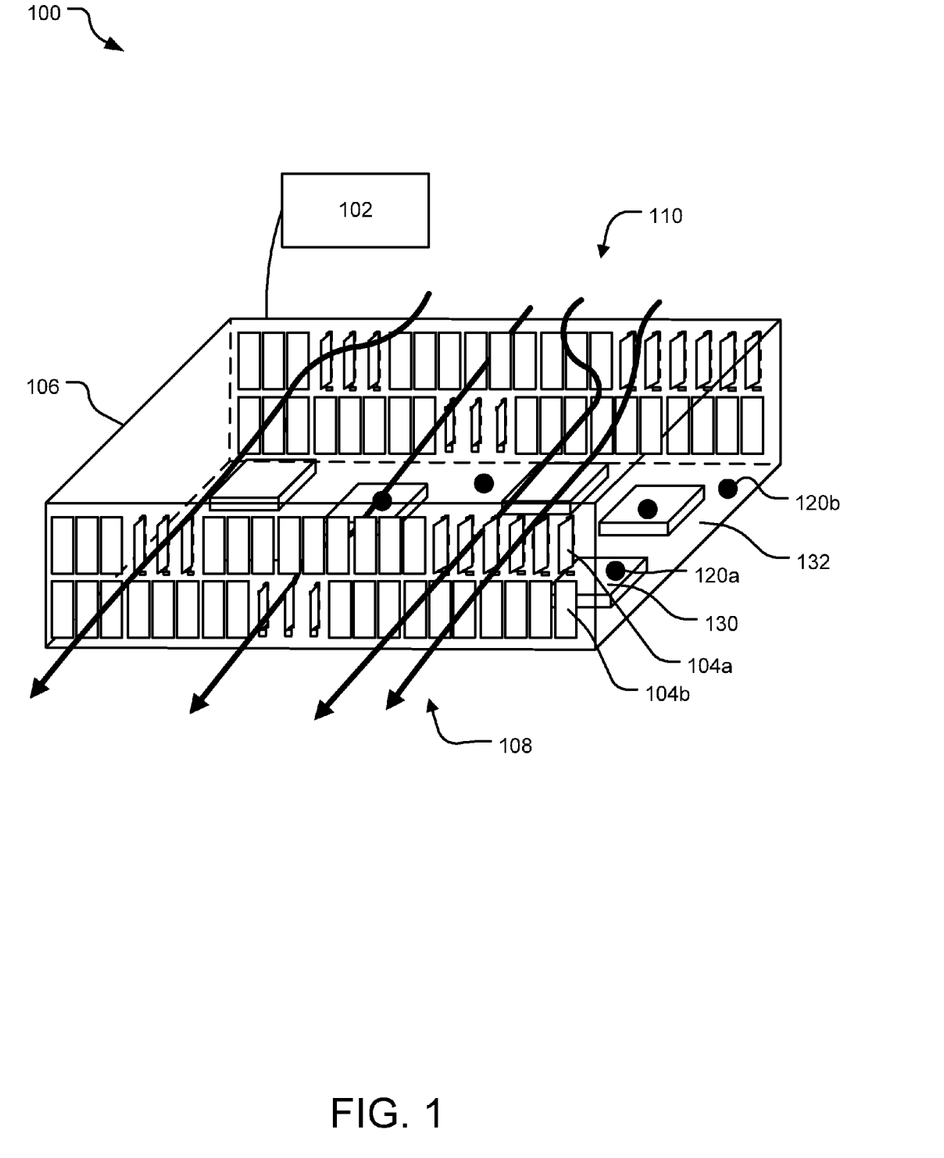
FIG. 1 illustrates a perspective isometric view of an example computing system enclosure management system with Venetian blind-like baffles.

FIG. 1 illustrates a perspective isometric view of an example computing system enclosure management system 100. The system 100 includes a computing system enclosure 106 connected to a controller 102. Note that while the controller 102 is illustrated as being external to the computing system enclosure 106, in actual implementations of the computing system enclosure 106, the controller 102 may be either external to the computing system enclosure 106 or internal thereto.

The computing system enclosure 106 includes a plurality of airflow redirection modules 104a and 104b, or in some embodiments known as baffles 104a, 104b (hereinafter, referred to as baffles 104) located on a front end 108 and a rear end 110 of the enclosure 106. The airflow redirection modules or baffles 104 may have different shapes and structures. In one implementation, the airflow redirection modules or baffles 104 may be flat plates. In another implementation, the airflow redirection modules or baffles 104 may be shaped to reduce acoustic noise, turbulence effects or other deleterious aerodynamic or acoustic effects. For example, the airflow redirection modules or baffles 104 may have "owl wing" features (i.e., a combination of stiff and flexible elements which substantially reduce noise).

In this implementation, airflow moves from the rear end 110 to the front end 108. In alternative implementations, the airflow direction may be in other directions, such as from top to bottom, bottom to top, from left to right, etc. Based on the direction of the airflow, the baffles 104 may be provided in alternative locations within the computing system enclosure 106. For example, if the airflow was to be from left to right, baffles 104 may be provided on the left or the right surface, etc. Yet alternatively, the baffles 104 may also be provided internally away from the sidewalls of the computing system enclosure 106. For example, a series of baffles 104 may be provided in the middle of the computing system enclosure 106 between the front end 108 and the rear end 110.

The baffles 104 in FIG. 1 are Venetian blind-like ("Venetian") baffles. In other words, each of such Venetian baffles 104 may be configured to rotate around a vertical axis. For example, in FIG. 1, the Venetian baffle 104*b* is illustrated as being substantially parallel to the front end 108 and the Venetian baffle 104*a* is illustrated as being rotated at an angle, such that it is not parallel to the front end 108. In some implementations, the Venetian baffles 104 may be motorized and/or programmable. The Venetian baffles 104 can be rotated by different degrees depending on a desired airflow.

The controller 102 of the enclosure management system 100 controls the configuration of the baffles 104 and the corresponding airflow distribution at any given time. As work loads change over time within the computing system enclosure 106 (e.g., change in location, number and/or intensity of hot spots, such as hot spots around a hard disk drive, a system suddenly becoming inoperative, or a reduced work load on an ASIC), changes may be required in the configurations of baffles 104 to provide the most optimum air flow distribution subject to the constraints involved. The controller 102 dynamically monitors various parameters within the computing system enclosure 106, analyzes the monitored parameters, and provides feedback based on the monitored results to determine a profile (e.g., a computing system enclosure profile) to control airflow distribution within the computing system enclosure 106.

In FIG. 1, the controller 102 controls the Venetian baffles 104 in response to output from sensors (e.g., temperature sensors 120*a* and 120*b*, or collectively, sensors 120). There can be a variety of sensors 120 located in a variety of locations in the computing system enclosure 106. For example, a plurality of temperature sensors 120 may be mounted on printed circuit boards (PCBs) (e.g., PCB 132), which are mounted within the computing system enclosure 106, or part of one of the field replaceable units (FRUs). For example, a cooling module may have the PCB 132 with a fan control circuit on it, which would also have a thermal sensor 120. Sensors 120 can also be located on devices (e.g., devices 130). For example, an application controller (server) may have multiple thermal sensors 120, some contained within the devices (CPU, dual in-time memory modules (DIMM), etc.) and some separate ones mounted on a PCB itself. Sensors 120 may also be fitted to a midplane and/or on an operator panel at the front end 108 of the computing system enclosure 106, which measures ambient conditions.

The temperature sensors 120*a* and 120*b* in the computing system enclosure 106 measure temperature on a continuous or periodic basis and send such temperature measurements to the controller 102. The controller 102 generates a temperature profile of the computing system enclosure 106 and controls the Venetian baffles 104 based on such temperature profile. The controller 102 determines whether the temperature of the computing system enclosure 106 is too high at one or more locations. For example, if the temperature profile of the computing system enclosure 106 indicates higher temperature in the upper section of the front end 108, the controller 102 may send signals to open the Venetian baffle 104*a* on the upper section of the front end 108 of the enclosure 106, close the Venetian baffle 104*b*, or change the orientation of the Venetian baffles 104. As a result, the airflow moving from the back end 110 to the front end 108 can dissipate out the heat on the upper level of the front end 108 of the enclosure 106.

In an alternative implementation, the controller 102 may dynamically measure other parameters of the computing system enclosure 106, such as the workload distribution of the computing system enclosure 106. Based on such measurements, the controller 102 determines a workload profile of the computing system enclosure 106 and uses such workload profile to control the Venetian baffles 104. For example, the workload profile may be used to redirect the airflow distribution by changing the orientation (e.g., the three-dimensional orientation) of the Venetian baffles 104. In another implementation of an application controller, certain workloads stress the DIMM memory more than the CPUs, while others stress the CPU more than the DIMM memory. This factor can be recognized in the power budgets of systems, where a utilization percentage is applied to the powers as it is recognized that both cannot be at a maximum at the same time.

Other example measured parameters of the computing system enclosure 106 used to generate computing system enclosure profile can include the presence of hot spots, the location of hot spots, the temperature of hot spots, the temperature of the entire computing system enclosure 106, the functioning levels of specific Venetian baffles 104, etc. Yet alternatively, one or more of the Venetian baffles 104 may be used to measure the direction of the airflow. Such measurement of the direction of the airflow may be used as input for generating an airflow distribution profile of the computing system enclosure 106.

In another implementation, the computing system enclosure 106 may have sensors 120, which monitor the computing system enclosure 106 and provide feedback to the controller 102 regarding whether or not there are hot spots in the enclosure 106, where such hot spots are located in the enclosure 106, and the specific temperature of such hot spots. In response to the feedback, the controller 102 can signal specific Venetian baffles 104 located near the identified hot spots, and redirect airflow based on an assessment that cooling is needed near that specific hot spot. The controller 102 can send signals to the Venetian baffles 104 communicating that the orientation of the Venetian baffles 104 need to change in a desired direction. Or, in another implementation, the Venetian baffles 104 may be programmable and respond to feedback directly from the sensors 120.

In another implementation, the controller 102 determines a performance profile of the Venetian baffles 104. For example, sensors 120 monitor actuation of Venetian baffles 104 and provide feedback to the controller 102 regarding functioning levels of the Venetian baffles 104 and a condition of airflow distribution based on the function of the Venetian baffles 104. After determining that a specific Venetian baffle 104 is not working properly, the controller 102 may send signals to an interface (not shown) regarding malfunction and/or redirect airflow based on a deficiency of the malfunctioning Venetian baffle 104. In other implementations, the computing system enclosure management system 100 may monitor and identify the profile of other components in the enclosure 106 (e.g., a specific drive is overheating) and control airflow distribution via the baffles 104 and/or fans or other components, to address an undesirable condition.

For example, due to the mechanical nature of the baffles 104, the baffles 104 can encounter mechanical failure. For example, airflow over fan blades, ducts, etc. may lead to dust accumulation around edges and hinge points of baffles 104; either preventing the baffles 104 from moving, or preventing them from sealing appropriately. The computing system enclosure management system 100 dynamically monitors the computing system enclosure 106 for such conditions.

Alternatively, in other implementations, the computing system enclosure profile can comprise of multiple determined profiles (e.g., an enclosure temperature profile, a baffle performance profile, enclosure workload profile, etc.) that are collectively analyzed in order to control the orientation of baffles 104 and/or fans to redirect airflow distribution in the computing system enclosure 106. Dynamically monitoring, controlling the baffles 104, and redirecting airflow distribution to or from specific locations in the computing system enclosure reduces power consumption in a system that would otherwise require system-wide modifications.

In some implementations, the algorithms governing the orientations of the baffles 104 can minimize the change in resistance of airflow through the enclosure. For example, changes can be minimized in a total airflow cross-section when changing from one orientation configuration to another.

Algorithms may be directed toward operating the baffles 104 in pairs. For example, an algorithm may open one baffle 104 in a pair and close the other baffle 104. Each system creates an airflow impedance or pressure drop for a particular airflow (referred to as a "PQ curve"). The algorithms can minimize disruption of the airflow impedance of the system. If the baffles 104 significantly increase the airflow impedance of the computing system enclosure 106, the airflow can drop and the system may be unable to maintain cooling. The disclosed technology includes an adaptive system. The controller 102 identifies whether or not the computing system enclosure 106 is not operating at a maximum configuration and adjusts the baffles 104 to direct the airflow accordingly, reducing the overall airflow to match the system configuration.

Figure 2:
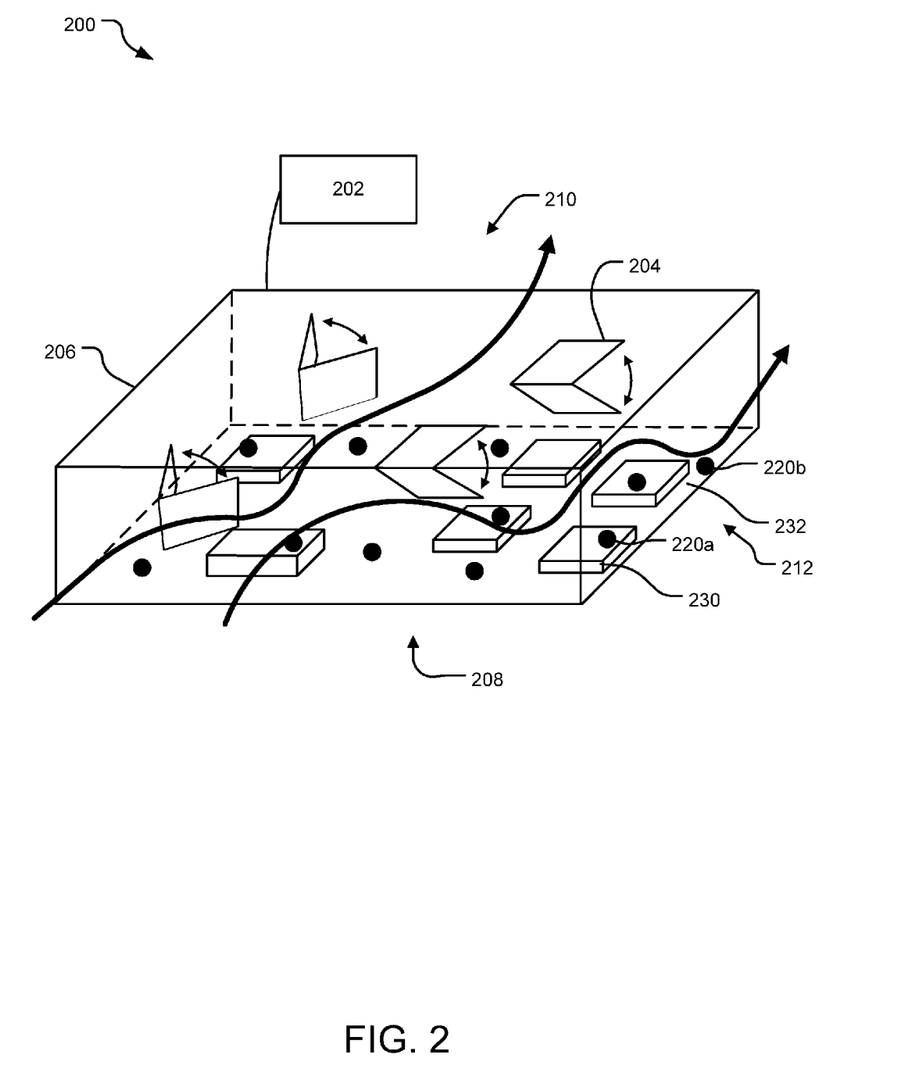
FIG. 2 illustrates a perspective isometric view of an example computing system enclosure management system with bulk baffles.

FIG. 2 illustrates a perspective isometric view of an example computing system enclosure management system 200 with bulk baffles 204. The system 200 includes a computing system enclosure 206 and is connected to a controller 202. The computing system enclosure 206 includes four bulk baffles 204 that are located throughout the enclosure 206. The direction of airflow distribution in the enclosure 206 can vary. In this implementation, airflow moves from a front end 208 to a rear end 210 and to a side end 212.

In alternative implementations, the airflow distribution may occur in other directions; such as from top to bottom, bottom to top, left to right, etc. Based on the direction of the airflow, the bulk baffles 204 may be provided in alternative locations within the computing system enclosure 206. For example, if the airflow moves from left to right, bulk baffles 204 may be provided on the left or the right surface, etc. Yet alternatively, the bulk baffles 204 may also be provided internally away from the sidewalls of the computing system enclosure 206. For example, a series of bulk baffles 204 may be provided in the middle of the computing system enclosure 206, between the front end 208 and the rear end 210.

The bulk baffles 204 in FIG. 2 are in different key locations throughout the enclosure 206, which can affect large-scale changes in airflow direction. The bulk baffles 204 can be rotated by different degrees depending on a desired airflow or open and close. The bulk baffles 204 can have a number of different configurations which provide different functionality. For example, there can be simple flap bulk baffles 204, which are operated by a lever at a side end 212 and hinged at a rear end 210. The lever can be operated locally, or remotely by pushrod, cable snake, bellcrank, etc. In another implementation, the bulk baffles 204 can have flaps with a rotary cam, or a flap with a rear hinge, operated by a local rotary actuator with a cam profile on an upper surface. As the actuator rotates, the cam also rotates, which raises and/or lowers the flap. Other implementations include magnetic/electro-magnetic, piezo electric, pneumatic, hydraulic, etc. Another implementation may include an electro-magnetic or piezo operation between two states with a zero power state at each extremity.

In some implementations, the bulk baffles 204 may be motorized and/or programmable. The controller 202 of the enclosure management system 200 controls the configuration of the baffles 204, and the corresponding airflow distribution at any given time. As work loads change over time within the computing system enclosure 206 (e.g., change in location, number and/or intensity of hot spots, such as hot spots around a hard disk drive, a system suddenly becoming inoperative, or a reduced work load on an ASIC), changes may be required in the configurations of baffles 204 to provide the most optimum air flow distribution, subject to the constraints involved. The controller 202 dynamically monitors various parameters within the computing system enclosure 206, analyzes the monitored parameters, and provides feedback based on the monitored results to determine a profile (e.g., a computing system enclosure profile) to control airflow distribution within the computing system enclosure 206.

In FIG. 2, the controller 202 controls the bulk baffles 204 in response to output from sensors (e.g., sensors 220a and 220b, or collectively, 220). There can be a variety of sensors 220 located in a variety of locations in the computing system enclosure 206. For example, a plurality of temperature sensors 220 may be mounted on printed circuit boards (PCBs) (e.g., PCB 232), which are mounted within the computing system enclosure 206, or part of one of the field replaceable units (FRUs). For example, a cooling module may have the PCB 232 with a fan control circuit on it, which would also have a thermal sensor 220. Sensors (e.g., sensor 220a) can also be located on devices (e.g., devices 230). For example, an application controller (server) may have multiple thermal sensors, some contained within the devices (e.g., CPU, DIMM, etc.) and some separate ones mounted on a PCB 232 itself. Sensors 220 may also be fitted to a midplane and/or on an operator panel at the front end 208 of the computing system enclosure 206, which measure ambient conditions.

The temperature sensors 220 measure temperature on a continuous or periodic basis and send such temperature measurements to the controller 202. The controller 202 generates a temperature profile of the computing system enclosure 206 and controls the bulk baffles 204, based on such temperature profile. The controller 202 determines whether the temperature of the computing system enclosure 206 is too high at one or more locations. For example, if the temperature profile of the computing system enclosure 206 indicates higher temperature in the upper section of the front end 208, the controller 202 may send signals to open the bulk baffle 204a on the upper section of the front end 208 of the enclosure 206, close the bulk baffle 204b, or change the orientation of the bulk baffles 204 so that the airflow moving from the back end 210 to the front end 208 can dissipate out the heat on the upper level of the front end 208 of the enclosure 206.

In an alternative implementation, the controller 202 may dynamically measure other parameters of the computing system enclosure 206, such as the workload distribution of the computing system enclosure 206. Based on such measurements, the controller 202 determines a workload profile of the computing system enclosure 206 and uses such workload profile to control the bulk baffles 204. For example, the workload profile may be used to redirect the airflow distribution by changing the orientation (e.g., the three-dimensional orientation) of the bulk baffles 204.

Other example measured parameters of the computing system enclosure 206 used to generate a computing system enclosure profile can include the presence of hot spots, the location of hot spots, the temperature of hot spots, the temperature of the entire enclosure 206, the functioning levels of specific bulk baffles 204, etc. Yet alternatively, one or more of the Venetian baffles 204 may be used to measure the direction of the airflow. Such measurement of the direction of the airflow may be used as input for generating an airflow distribution profile of the computing system enclosure 206.

The computing system enclosure 206 may have sensors (e.g., sensors 220), which monitor the enclosure 206 and provide feedback to the controller 202 regarding whether or not there are hot spots in the enclosure 206, where such hot spots are located in the enclosure 206, and the specific temperature of such hot spots. In response to the feedback, the controller 202 can signal specific bulk baffles 204, which are located near the identified hot spots, and redirect airflow based on an assessment that cooling is needed near that specific hot spot. The controller 202 can send signals to the bulk baffles 204, communicating that the orientation of the bulk baffles 204 need to change in a desired direction. Or, in another implementation, the bulk baffles 204 may be programmable and respond to feedback directly from the sensors 220.

In another implementation, the controller 202 determines a performance profile of the bulk baffles 204. For example, sensors 220 monitor actuation of bulk baffles 204 and provide feedback to the controller 202 regarding functioning levels of the bulk baffles 204 and a condition of airflow distribution based on the function of the bulk baffles 204. After determining that a specific bulk baffle 204 is not working properly, the controller 202 may send signals to an interface (not shown) regarding malfunction and/or redirect airflow distribution based on a deficiency of the malfunctioning bulk baffle 204. In other implementations, the computing system enclosure management system 200 may monitor and identify the profile of other components in the enclosure 206 (e.g., a specific drive is overheating) and control airflow via the bulk baffles 204 and/or fans or other components, to address an undesirable condition.

For example, due to the mechanical nature of bulk baffles 204, baffles 204 can encounter mechanical failure. For example, airflow over fan blades, ducts, etc. may lead to dust accumulation around edges and hinge points of baffles 204—either preventing the bulk baffles 204 from moving, or preventing them from sealing appropriately. The computing management system 200 dynamically monitors the enclosure 206 for such conditions.

Alternatively, in other implementations, the computing system enclosure profile can comprise of multiple determined profiles (e.g., an enclosure temperature profile, a baffle performance profile, enclosure workload profile, etc.) that are collectively analyzed in order to control the orientation of baffles 204 and/or fans to redirect airflow distribution in the enclosure 206. Dynamically monitoring, controlling, and redirecting airflow distribution to or from specific locations reduces power consumption in a system that would otherwise require system-wide modifications.

Figure 3:
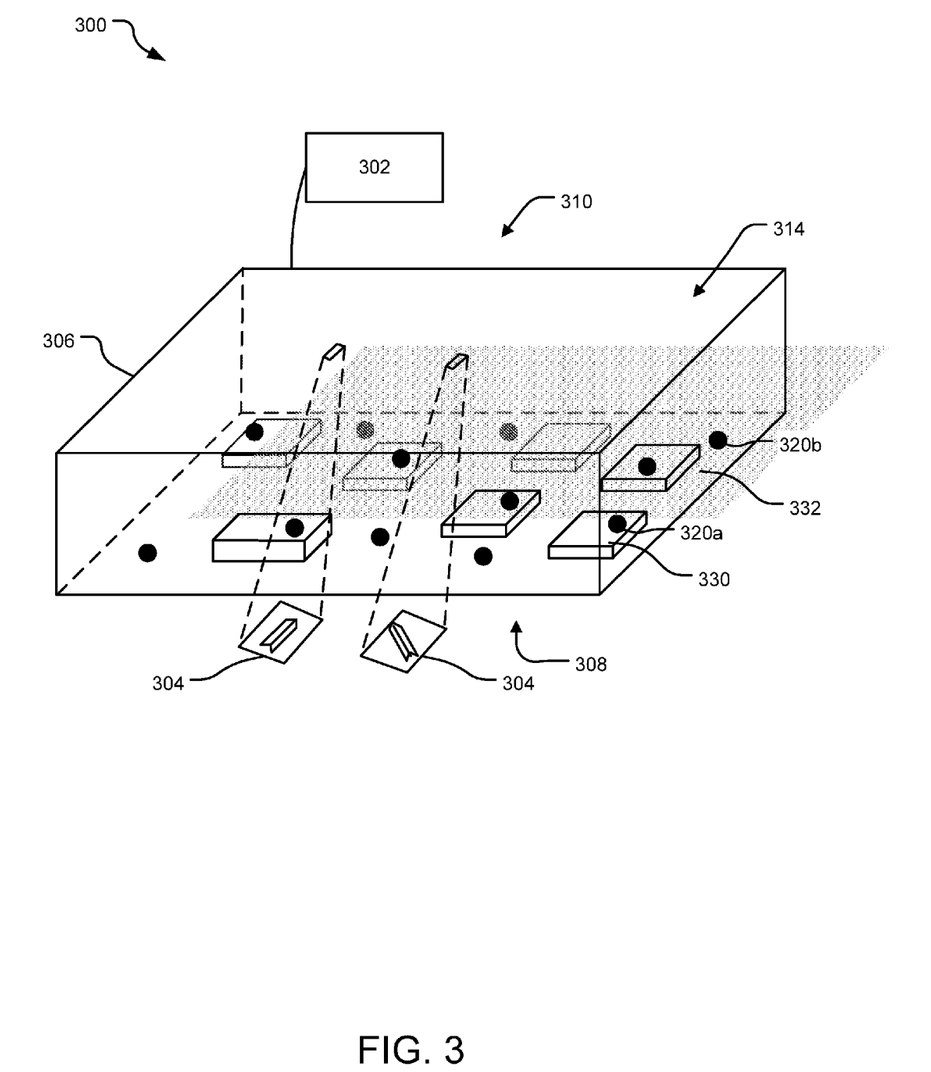
FIG. 3 illustrates a perspective isometric view of an example computing system enclosure management system with microbaffles.

FIG. 3 illustrates a perspective isometric view of an example computing system enclosure management system 300 with microbaffles 304. The system 300 includes a computing system enclosure 306 and is connected to a controller 302. The computing system enclosure 306 includes two microbaffles 304 that are located on a top end 314 of the enclosure 306.

The microbaffles 304 have a width significantly greater than their height and length, with a hinge operation located on a long edge. Within a storage enclosure many of the components in the microbaffles 304 are tightly spaced with minimal air gaps. For example, within a 2 U 24 drive enclosure with 24 2.5 in SFF drives, the drives are 15 mm tall, but are placed on a 17.75 mm pitch (excluding any disk drive carrier). As a result, there is approximately a 2.75 mm air gap. In another example, the microbaffle 304 with a 1 mm height, reduces a gap to approximately 1.75 mm, or a 36% reduction.

Another aspect is where the microbaffles 304 are placed. Most thermal studies assume laminar airflow, however, this can limit the amount of heat that the air can extract. A small baffle (microbaffle 304) can disrupt this airflow and cause turbulent flow, enabling the air to carry greater amounts of heat away from the device that it is cooling.

The direction of airflow distribution in the enclosure 306 can vary. In this implementation, where airflow moves from left to right, the microbaffles 304 are oriented to have a long side perpendicular to the direction of airflow.

In alternative implementations, the airflow may travel in other directions, such as from top to bottom, bottom to top, etc. The microbaffles 304 are oriented to have a long side perpendicular to the direction of airflow. Based on the direction of the airflow, the microbaffles 304 may be provided in alternative locations within the computing system enclosure 306. For example, if the airflow travels left to right, microbaffles 304 may be located toward or on the left or the right surface, etc. Yet alternatively, the baffles 304 may also be located internally away from the sidewalls of the computing system enclosure 306.

The microbaffles 304 in FIG. 3 are located in different key locations throughout the enclosure 306, which can affect large-scale changes in airflow direction. The microbaffles 304 can rotate by different degrees, or open or close depending on a desired airflow. The microbaffles 304 can have a number of different configurations which provide different functionality. For example, there can be simple flap bulk microbaffles 304, which are operated by a lever on one side and hinged at another side. The lever can be operated locally, or remotely by pushrod, cable snake, bellcrank etc. In another implementation, the microbaffles 304 can have flaps with a rotary cam, or a flap with a rear hinge, operated by a local rotary actuator with a cam profile on its upper surface. As the actuator rotates, the cam also rotates, which raises and/or lowers the flap. Other implementations include magnetic/electro-magnetic, piezo electric, pneumatic, hydraulic, etc. Another implementation may include an electro-magnetic or piezo operation between two states with a zero power state at each extremity.

In some implementations, the microbaffles 304 may be motorized and/or programmable. The controller 302 of the enclosure management system 300 controls the configuration of the microbaffles 304, and the corresponding airflow distribution at any given time. As work loads change over time within a computing system enclosure 306 (e.g., change in location, number and/or intensity of hot spots, such as hot spots around a hard disk drive, a system suddenly becoming inoperative, or a reduced work load on an ASIC), changes may be required in the configurations of microbaffles 304 to provide the most optimum airflow distribution subject to the constraints involved. The controller 302 dynamically monitors various parameters within the computing system enclosure 306, analyzes the monitored parameters, and provides feedback based on the monitored results to determine a profile (e.g., a computing system enclosure profile) to control airflow distribution within the computing system enclosure 306.

In FIG. 3, the controller 302 controls the microbaffles 304 in response to output from sensors (e.g., sensors 320a and 320b, collectively, 320). There can be a variety of sensors 320 located in a variety of locations in the computing system enclosure 306. For example, a plurality of temperature sensors 320 may be mounted on printed circuit boards (PCBs) (e.g., PCB 332), which are mounted within the computing system enclosure 306, or part of one of the field replaceable units (FRUs). For example, a cooling module may have the PCB 332 with a fan control circuit on it, which would also have a thermal sensor 320. Sensors (e.g., sensor 320a) can also be located on devices (e.g., devices 330). For example, an application controller (server) may have multiple thermal sensors, some contained within the devices (CPU, DIMM, etc.) and some separate ones mounted on a PCB 332. Sensors 320 may also be fitted to a midplane and/or on an operator panel at the front of the computing system enclosure 306, which measure ambient conditions.

The temperature sensors 320 measure temperature on a continuous or periodic basis and send such temperature measurements to the controller 302. The controller 302 generates a temperature profile of the computing system enclosure 306 and controls the microbaffles 304 based on such temperature profile. The controller 302 determines whether the temperature of the computing system enclosure 306 is too high at one or more locations. For example, if the temperature profile of the computing system enclosure 306 indicates higher temperature in upper section of the front end 308, the controller 302 may send signals to open the microbaffle 304a on the upper section of a front end 308 of the enclosure 306, close the microbaffle 304b, or change the orientation of the microbaffles 304 so that the airflow moving from a back end 310 to the front end 308 can dissipate out the heat on the upper level of the front end 308 of the enclosure 306.

In an alternative implementation, the controller 302 may dynamically measure other parameters of the computing system enclosure 306, such as the workload distribution of the computing system enclosure 306. Based on such measurements, the controller 302 determines a workload profile of the computing system enclosure 306 and uses such workload profile to control the microbaffles 304. For example, the workload profile may be used to redirect the airflow distribution by changing the orientation (e.g., the three-dimensional orientation) of the microbaffles 304.

Other example measured parameters of the computing system enclosure 306 used to generate a computing system enclosure profile can include the presence of hot spots, the location of hot spots, the temperature of hot spots, the temperature of the entire computing system enclosure 306, the functioning levels of specific microbaffles 304, etc.

In another implementation, the computing system enclosure 306 may have sensors 320, which monitor the enclosure 306 and provide feedback to the controller 302 regarding whether or not there are hot spots in the enclosure 306, where such hot spots are located in the enclosure 306, and the specific temperature of such hot spots. In response to the feedback, the controller 302 can signal specific microbaffles 304, which are located near the identified hot spots, and redirect airflow based on an assessment that cooling is needed near that specific hot spot. The controller 302 can send signals to the microbaffles 304 communicating that the orientation of the microbaffles 304 need to change in a desired direction. Or, in another implementation, the microbaffles 304 may be programmable and respond to feedback directly from the sensors 320.

In another implementation, the controller 302 determines a performance profile of the microbaffles 304. For example, sensors 320 monitor actuation of microbaffles 304 and provide feedback to the controller 302 regarding functioning levels of the microbaffles 304 and a condition of airflow distribution based on the function of the microbaffles 304. After determining that a specific microbaffle 304 is not working properly, the controller 302 may send signals to an interface (not shown) regarding malfunction and/or redirect airflow distribution based on a deficiency of the malfunctioning microbaffle 304. In other implementations, the management system 300 may monitor and identify the profile of other components in the enclosure 306 (e.g., a specific drive is overheating) and control airflow via the microbaffles 304 and/or fans or other components to address an undesirable condition.

For example, due to the mechanical nature of microbaffles 304, microbaffles 304 can encounter mechanical failure. For example, airflow over fan blades, ducts, etc. may lead to dust accumulation around edges and hinge points of the microbaffles 304—either preventing the microbaffles 304 from moving, or preventing them from sealing appropriately. The computing management system 300 dynamically monitors the enclosure 306 for such conditions.

Alternatively, in other implementations, the computing system enclosure profile can comprise of multiple determined profiles (e.g., an enclosure temperature profile, a microbaffle 304 performance profile, enclosure workload profile, etc.) that are collectively analyzed in order to control the orientation of microbaffles 304 and/or fans to redirect airflow distribution in the enclosure 306. Dynamically monitoring, controlling, and redirecting airflow distribution to or from specific locations reduces power consumption in a system that would otherwise require system-wide modifications.

Figure 4:
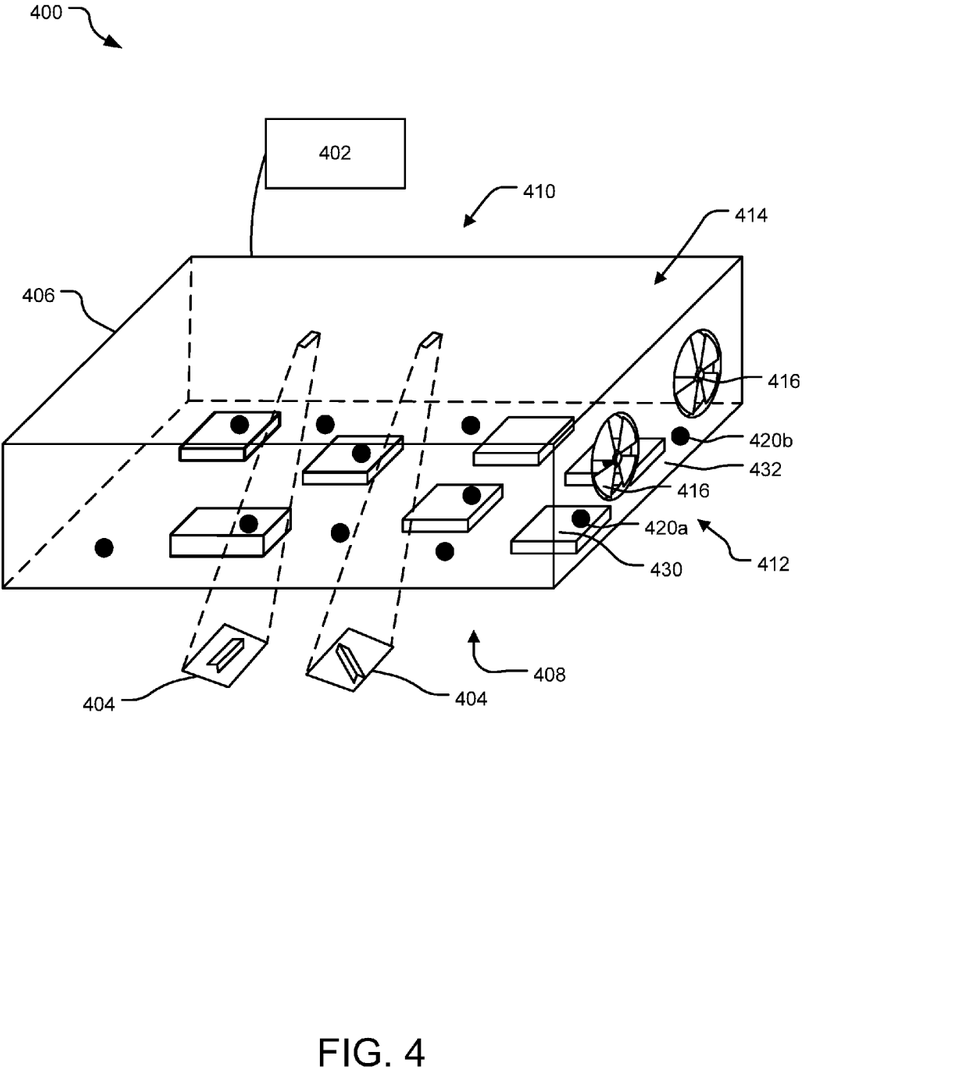
FIG. 4 illustrates a perspective isometric view of an example computing system enclosure management system with microbaffles and fans.

FIG. 4 illustrates a perspective isometric view of an example computing system enclosure management system 400 with microbaffles 404 and fans 416. In conjunction with the microbaffles 404, overall fan strength can be varied. The existing air flow can be concentrated over areas of the system 400 in use and divert away from areas not in use.

The system 400 includes a computing system enclosure 406 and is connected to a controller 402. The computing system enclosure 406 includes two microbaffles 404 that are located on a top end 414 of the enclosure 406 and two fans 416 on a side end 412. The direction of airflow distribution in the enclosure 406 can vary. In this implementation, the microbaffles 404 would normally be oriented to have a long side perpendicular to the direction of the airflow. The microbaffles 404 may be located substantially perpendicular to the left and right sides of the enclosure 406. The airflow can travel in a left to right, or right to left direction.

In alternative implementations, the airflow may travel in other directions, such as from top to bottom, bottom to top, from left to right, etc. Based on the direction of the airflow, the microbaffles 404 may be provided in alternative locations within the computing system enclosure 406. For example, if the airflow travels from left to right, microbaffles 404 may be provided on a left or a right surface, etc. Yet alternatively, the microbaffles 404 may also be provided internally away from the sidewalls of the computing system enclosure 406.

The microbaffles 404 in FIG. 4 are microbaffles in different key locations throughout the enclosure 406, which can affect large-scale changes in airflow direction. The microbaffles 404 can rotate by different degrees, or open and close depending on a desired airflow. For example, microbaffles 404 may be on twisted pivoted actuators, which induce rotation over a certain range in response to a control stimulus (e.g., voltage, current, etc.).

In some implementations, the microbaffles 404 and fans 416 may be motorized and/or programmable. The controller 402 of the enclosure management system 400 controls the configuration of the microbaffles 404, and the corresponding airflow distribution at any given time. As work loads change over time within the computing system enclosure 406 (e.g., change in location, number and/or intensity of hot spots, such as hot spots around a hard disk drive, a system suddenly becoming inoperative, or a reduced work load on an ASIC), changes may be required in the configurations of microbaffles 404 to provide the most optimum airflow distribution subject to the constraints involved. The controller 402 dynamically monitors various parameters within the computing system enclosure 406, analyzes the monitored parameters, and provides feedback based on the monitored results to determine a profile (e.g., a computing system enclosure profile) to control airflow distribution within the computing system enclosure 406.

In FIG. 4, the controller 402 controls the microbaffles 404 in response to output from sensors (e.g., sensors 420a and 420b, or collectively, sensor 420). There can be a variety of sensors 420 located in a variety of locations in the computing system enclosure 406. For example, a plurality of temperature sensors 420 may be mounted on printed circuit boards (PCBs) (e.g., PCB 432), which are mounted within the computing system enclosure 406, or part of one of the field replaceable units (FRUs). For example, a cooling module may have a PCB 432 with a fan control circuit on it, which would also have a thermal sensor 420. Sensors (e.g., sensor 420a) can also be located on devices (e.g., devices 430). For example, an application controller (server) may have multiple thermal sensors, some contained within the devices (CPU, DIMM, etc.) and some separate ones mounted on a PCB 432. Sensors 420 may also be fitted to a midplane and/or on an operator panel at the front of the computing system enclosure 406, which measure ambient conditions.

The temperature sensors 420 measure temperature on a continuous or periodic basis and send such temperature measurements to the controller 402. The controller 402 generates a temperature profile of the computing system enclosure 406 and controls the microbaffles 404 based on such temperature profile. The controller 402 determines whether the temperature of the computing system enclosure 406 is too high at one or more locations. For example, if the temperature profile of the computing system enclosure 406 indicates higher temperature in the upper section of a front end 408, the controller 402 may send signals to open a microbaffle 404 on the upper section of the front end 408 of the enclosure 406, close another microbaffle 404, or change the orientation of the microbaffles 404 so that the airflow moving from a back end 410 to the front end 408 can dissipate out the heat on the upper level of the front end 408 of the enclosure 406.

In an alternative implementation, the controller 402 may dynamically measure other parameters of the computing system enclosure 406, such as the workload distribution of the computing system enclosure 406. Based on such measurements, the controller 402 determines a workload profile of the computing system enclosure 406 and uses such workload profile to control the microbaffles 404 and fans 416. For example, the workload profile may be used to redirect the airflow distribution by changing the orientation (e.g., the three-dimensional orientation) of the microbaffles 404 and varying fan 416 speed.

Other example measured parameters of the computing system enclosure 406 used to generate a computing system enclosure profile can include the presence of hot spots, the location of hot spots, the temperature of hot spots, the temperature of the entire enclosure 406, the functioning levels of specific microbaffles 404, etc. Yet alternatively, one or more of the microbaffles 404 may be used to measure the direction of the airflow. Such measurement of the direction of the airflow may be used as input for generating an airflow distribution profile of the computing system enclosure 406. Alternatively, in other implementations, the computing system enclosure profile can comprise of multiple determined profiles (e.g., an enclosure temperature profile, a microbaffle performance profile, enclosure workload profile, etc.) that are collectively analyzed in order to control the orientation of microbaffles 404 and/or fans 416 to redirect airflow distribution in the enclosure 406. Dynamically monitoring, controlling, and redirecting airflow distribution to or from specific locations reduces power consumption in a system that would otherwise require system-wide modifications.

In another implementation, the computing system enclosure 406 may have sensors 420, which monitor the enclosure 406 and provide feedback to the controller 402 regarding whether or not there are hot spots in the enclosure 406, where such hot spots are located in the enclosure 406, and the specific temperature of such hot spots. In response to the feedback, the controller 402 can signal specific microbaffles 404, which are located near the identified hot spots, and redirect airflow based on an assessment that cooling is needed near that specific hot spot. The controller 402 can send signals to the microbaffles 404 communicating that the orientation of the microbaffles 404 need to change in a desired direction. Or, in another implementation, the microbaffles 404 may be programmable and respond to feedback directly from the sensors 420. Dynamically monitoring, controlling, and redirecting airflow distribution to or from specific locations reduces power consumption in a system that would otherwise require system-wide modifications.

In another implementation, the controller 402 determines a performance profile of the microbaffles 404 and fans 416. For example, sensors 420 monitor actuation of microbaffles 404 and fans 416 and provide feedback to the controller 402 regarding functioning levels of the microbaffles 404 and fans 416 and a condition of airflow distribution based on the function of the microbaffles 404. After determining that a specific microbaffle 404 and/or fan 416 is not working properly, the controller 402 may send signals to an interface (not shown) regarding malfunction and/or redirect airflow distribution based on a deficiency of the malfunctioning microbaffle 404 and/or fan 416. In other implementations, the computing system enclosure management system 400 may monitor and identify the profile of other components in the enclosure 406 (e.g., a specific drive is overheating), and control airflow via the microbaffles 404 and/or fans 416 or other components to address an undesirable condition.

For example, due to the mechanical nature of microbaffles 404, microbaffles 404 can encounter mechanical failure. For example, airflow over fan blades, ducts, etc., may lead to dust accumulation around edges and hinge points of microbaffles 404—either preventing the microbaffles 404 from moving, or preventing them from sealing appropriately. The computing management system 400 dynamically monitors the enclosure 406 for such conditions.

Figure 5:
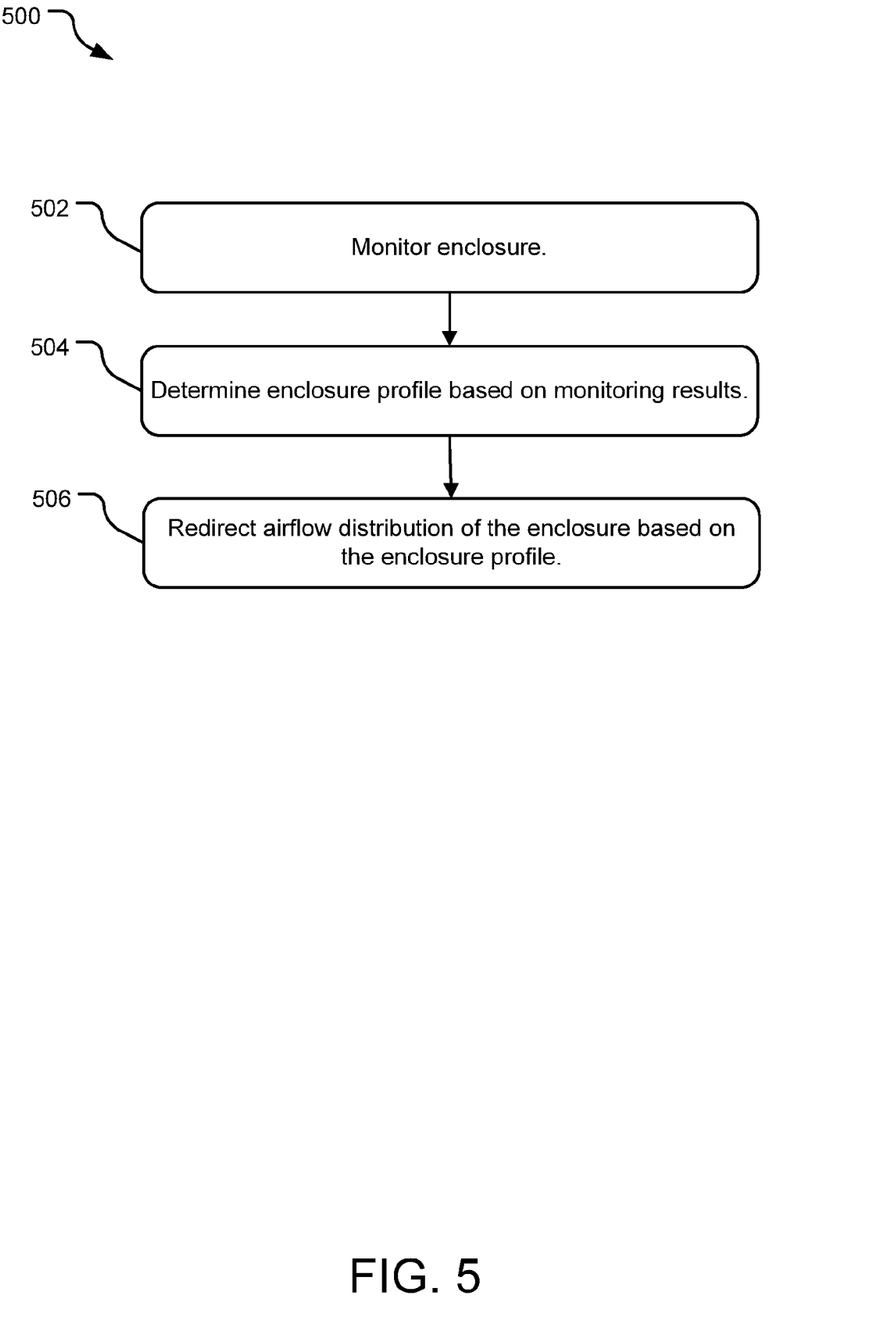
FIG. 5 illustrates example operations for redirection of airflow distribution in an example computing system enclosure management system.

FIG. 5 illustrates example operations for redirection of airflow in an example computing system enclosure management system 500. As work loads change over time within a computing system enclosure (e.g., change in location, number and/or intensity of hot spots, such as hot spots around a hard disk drive, or a system suddenly becoming inoperative, or has a reduced work load on an ASIC), changes may be required in the configurations of baffling structures or airflow redirection modules to provide the most optimum air flow distribution subject to the constraints involved. These required changes can be identified by monitoring the system 500.

An operation 502 dynamically monitors airflow distribution by monitoring various parameters (e.g., temperature, workload distribution) within a computing system enclosure. For example, a temperature sensor may dynamically monitor the overall temperature of an enclosure and provide a measured temperature output. In another example, the enclosure may have sensors, which monitor hot spots in the enclosure and provide measured outputs. In yet another example, sensors monitor actuation of baffles and provides measured outputs regarding the baffle functioning levels.

Monitoring can occur is a variety of ways. Examples include a multitude of sensors from thermal sensors and fan tachometer outputs to separate airflow or vibration sensors. Positioning magnetic sensors can provide "door open" type sensing. In some enclosures, the components can also be interrogated. "Status" data can be obtained "in-band" from the disk drives, which includes monitoring temperature and performance status. Also, controllers can have fault and error logs, which can provide a trigger of action.

An operation 504 determines a computing system enclosure profile based on monitored results of airflow distribution. The controller determines a profile (e.g., a computing system enclosure profile, a temperature profile) based on the measured parameters, and provides feedback to the controller regarding the computing system enclosure. In some implementations, the computing system enclosure profile can comprise of multiple determined profiles (an enclosure temperature profile, a baffle performance profile, etc.) that are collectively analyzed by the controller.

For example, operation 504 may determine a temperature profile based on the overall temperature parameters of the enclosure, or areas in the enclosure where hot spots are present. The temperature profile may be supported by software and/or hardware that compiles monitoring results and calculates whether or not operations need to occur to manage the temperature in the enclosure. Likewise, in an example where actuation of baffles is monitored, a performance profile may be determined and supported by software and/or hardware that compiles monitoring results and calculates whether or not operations need to take place to remedy any malfunctioning or mechanically failing baffles. The controller receives feedback regarding the determined profiles from the measured outputs and can send signals to initiate operations to modify the airflow distribution.

An operation 506 redirects airflow distribution in the computing system enclosure. The computing system enclosure management system controls the orientation of one or more baffles and/or fans based on a determined profile. For example, if sensors monitor temperature parameters in an enclosure, and the controller analyzes the measured temperature parameters and determines a temperature profile which provides that the overall enclosure temperature is too high, the controller can redirect airflow distribution by opening baffles in specific areas for heat to dissipate. In another example, in conjunction with the baffles, the controller can control overall fan speed, concentrate the existing air flow over specific areas of the enclosure, and divert air away from areas not in use.

The redirection of airflow distribution is performed while maintaining the total pressure profile in the enclosure as part of system management. For example, the orientation of the baffles is changed to ensure that fans do not stall and overheat the system downstream. The overall effect of the change in airflow distribution is taken into consideration.

The operations 502-506 can all occur dynamically, sequentially, or simultaneously, optimizing the airflow distribution within a computing system enclosure. As a result, power consumption is reduced.

The logical operations making up the embodiments of the invention described herein are referred to variously as operations, steps, objects, or modules. Furthermore, it should be understood that logical operations may be performed in any order, adding or omitting operations as desired, unless explicitly claimed otherwise or a specific order is inherently necessitated by the claim language.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A method comprising:
   determining a computing system enclosure profile of a computing system enclosure, including determining a performance profile of one or more baffles during baffle operation, determining a temperature profile, and determining a workload profile, collectively; and
   controlling an orientation of the one or more baffles of the computing system enclosure dynamically by changing a three-dimensional orientation of the baffles based on the workload profile for redirection of airflow distribution based on the computing system enclosure profile.

2. The method of claim 1, further comprising adjusting the orientation of the one or more baffles based on a measured temperature of the computing system enclosure.

3. The method of claim 1, further comprising adjusting the orientation of the one or more baffles based on identification of at least one of a presence of a hot spot in the computing system enclosure, a location of the hot spot, and a temperature of the hot spot.

4. The method of claim 1, wherein determining a performance profile of the one or more baffles includes monitoring actuation of the one or more baffles in the computing system enclosure with sensors.

5. A method comprising:
   monitoring airflow distribution, a temperature, and workload distribution within a computing system enclosure with a plurality of sensors;
   determining a performance profile of one or more baffles during baffle operation, a temperature profile, and a workload distribution profile based on the monitored airflow distribution; and
   controlling an orientation of the one or more baffles in the computing system enclosure by changing a three-dimensional orientation of the baffles for redirection of airflow distribution based on the determined performance profile, temperature profile, and workload distribution profile.

6. The method of claim 5, further comprising communicating results of the airflow distribution monitoring operation to a controller.

7. The method of claim 6, further comprising determining a computing system enclosure profile based on the communicated monitoring results.

8. The method of claim 5, wherein determining a performance profile of the one or more baffles includes monitoring actuation of the one or more baffles in the computing system enclosure.

9. The method of claim 5, further comprising identifying at least one of a presence of a hot spot, a location of a hot spot, and a temperature of a hot spot in the computing system enclosure.

10. A computing enclosure system comprising:
a plurality of airflow redirection modules; and
a controller configured to control an orientation of one or more of the airflow redirection modules by changing a three-dimensional orientation of the baffles for redirection of airflow distribution within the computing enclosure system based on determination of a computing system enclosure profile of the computing system enclosure, the computing system enclosure profile including a performance profile of the plurality of airflow redirection modules during baffle operation, a temperature profile, and a workload profile.

11. The computing enclosure system of claim 10, further comprising a temperature sensor configured to measure a temperature of the computing system enclosure.

12. The computing enclosure system of claim 10, further comprising a plurality of sensors configured to identify at least one of a presence of a hot spot, a location of the hot spot, and a temperature of the hot spot in the computing system enclosure.

13. The computing enclosure system of claim 10, further comprising a plurality of fans configured to operate in conjunction with the airflow redirection modules in redirection of airflow distribution within the computing enclosure system.

14. The computing enclosure system of claim 13, wherein strength of the plurality of fans can be varied in conjunction with the airflow redirection modules in redirection of airflow distribution within the computing enclosure system.

15. The computing enclosure system of claim 10, wherein the airflow redirection modules are bulk baffles.

16. The computing enclosure system of claim 10, wherein the airflow redirection modules are microbaffles.

17. The computing enclosure system of claim 10, wherein the plurality of airflow redirection modules is programmable and responds to feedback from sensors configured to monitor the computing enclosure system.

* * * * *